US012757544B2

(12) United States Patent
Li et al.

(10) Patent No.: US 12,757,544 B2
(45) Date of Patent: Oct. 6, 2026

(54) LIGHT-EMITTING UNIT

(71) Applicant: AUO Corporation, Hsin-Chu (TW)

(72) Inventors: Chun-Chieh Li, Hsin-Chu (TW); Han-Sheng Nian, Hsin-Chu (TW); Hsin-Hung Li, Hsin-Chu (TW); Yu-Cheng Shih, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 528 days.

(21) Appl. No.: 18/450,689

(22) Filed: Aug. 16, 2023

(65) Prior Publication Data

US 2024/0282896 A1 Aug. 22, 2024

(30) Foreign Application Priority Data

Feb. 21, 2023 (TW) ................................ 112106321

(51) Int. Cl.

*H01L 33/60* (2010.01)
*H10H 20/856* (2025.01)
*H10H 20/825* (2025.01)

(52) U.S. Cl.

CPC ......... *H10H 20/856* (2025.01); *H10H 20/825* (2025.01)

(58) Field of Classification Search

CPC ................ G02B 3/0006; G02B 3/0056; G02F 1/133526; H10F 39/8063; H10K 59/879; F21V 5/004; H10H 20/856; H10H 20/825

See application file for complete search history.

(56) References Cited

U.S. PATENT DOCUMENTS

2014/0361270 A1* 12/2014 Cui ...................... G02B 3/0043 257/40
2016/0178965 A1* 6/2016 Takayama ................ G02B 5/08 445/24
2022/0006058 A1* 1/2022 Huang ............. H10K 59/80515
2023/0378404 A1* 11/2023 Kim .................... H01L 25/0753

FOREIGN PATENT DOCUMENTS

CN 103474423 A 12/2013
CN 104676475 A 6/2015
CN 114078399 A 2/2022
CN 114628563 A 6/2022

* cited by examiner

*Primary Examiner* — John A Bodnar
(74) *Attorney, Agent, or Firm* — WPAT, PC

(57) ABSTRACT

A light-emitting unit includes a substrate, a light-emitting element, and a micro lens. The light-emitting element is disposed on the substrate. The micro lens surrounds the light-emitting element. The micro lens includes compound eye structures adjacent to each other. In a top view, each compound eye structure has a length and a width, and the light-emitting element has a length and a width. The length and width of each compound eye structure in the top view and the length and width of the light-emitting element in the top view substantially satisfy $1 \leq (L1/W1)/(L2/W2) \leq 1.5$, in which W1 is the width of the light-emitting element in the top view, L1 is the length of the light-emitting element in the top view, W2 is the width of each compound eye structure in the top view, and L2 is the length of each compound eye structure in the top view.

16 Claims, 14 Drawing Sheets

LIGHT-EMITTING UNIT

CROSS-REFERENCE TO RELATED APPLICATION

This application claims priority to Taiwan Application Serial Number 112106321, filed Feb. 21, 2023, which is herein incorporated by reference.

BACKGROUND

Field of Invention

The present disclosure relates to a light-emitting unit.

Description of Related Art

Combining augmented reality (AR) displays with micro light-emitting diodes (micro LED) enables better display effects in terms of efficiency, brightness, and color rendering. The micro lenses in the display play an important role in guiding light and determining the imaging results. However, the currently commonly used micro lenses cause a large amount of light loss and reduce the performance of the display due to their structures, sizes, and materials being used.

Accordingly, how to provide a light-emitting unit to solve the aforementioned problems becomes an important issue to be solved by those in the industry.

SUMMARY

An aspect of the disclosure is to provide a light-emitting unit that may efficiently solve the aforementioned problems.

According to some embodiments of the disclosure, a light-emitting unit includes a substrate, a light-emitting element, and a micro lens. The light-emitting element is disposed on the substrate. The micro lens surrounds the light-emitting element. The micro lens includes a plurality of compound eye structures adjacent to each other. In a top view, each of the plurality of compound eye structures has a length and a width, and the light-emitting element has a length and a width. The length and the width of the light-emitting element in the top view and the length and the width of each of the plurality of compound eye structures in the top view substantially satisfy $1 \leq (L1/W1)/(L2/W2) \leq 1.5$. W1 is the width of the light-emitting element in the top view. L1 is the length of the light-emitting element in the top view. W2 is the width of each of the plurality of compound eye structures in the top view. L2 is the length of each of the plurality of compound eye structures in the top view.

In some embodiments of the present disclosure, the plurality of compound eye structures includes a plurality of curved surfaces. Each of the plurality of curved surfaces has a radius of curvature between about 0.1 μm and about 5 μm. A height of the micro lens is greater than the radius of curvature.

In some embodiments of the present disclosure, the height of the micro lens is greater than or equal to about 5 μm.

In some embodiments of the present disclosure, each of the plurality of the curved surfaces is a spherical curved surface protruding away from the light-emitting element.

In some embodiments of the present disclosure, the micro lens has a refractive index between about 1.7 and about 1.9.

In some embodiments of the present disclosure, the light-emitting unit further includes a plurality of reflective walls. The reflective walls are disposed on a side wall of the light-emitting unit.

In some embodiments of the present disclosure, in the top view, an outline of each of the plurality of compound eye structures is substantially a rectangle.

In some embodiments of the present disclosure, the light-emitting element is an omni-angle micro light-emitting diode. A light-emitting angle of the light-emitting unit is between about 80 degrees and about 120 degrees.

In some embodiments of the present disclosure, the light-emitting unit further includes a reflective layer. The reflective layer is disposed between the substrate and the light-emitting element as well as between the substrate and the micro lens.

In some embodiments of the present disclosure, the light-emitting element has at least one surface in direct contact with the reflective layer.

In some embodiments of the present disclosure, the micro lens has at least one surface in direct contact with the reflective layer.

According to some other embodiments of the disclosure, a light-emitting unit includes a substrate, a light-emitting element, and a micro lens. The light-emitting element is disposed on the substrate. The micro lens surrounds the light-emitting element. The micro lens includes a plurality of compound eye structures adjacent to each other. In a top view, the light-emitting element has a shortest radial dimension. Each of the plurality of compound eye structures has a shortest radial dimension. The shortest radial dimension of the light-emitting element in the top view and the shortest radial dimension of each of the plurality of compound eye structures in the top view substantially satisfy $1 \leq (r1/r2) \leq 1.5$, wherein r1 is the shortest radial dimension of the light-emitting element in the top view, and r2 is the shortest radial dimension of each of the plurality of compound eye structures in the top view.

In some embodiments of the present disclosure, in the top view, an outline of each of the plurality of compound eye structures is substantially a hexagon.

In some embodiments of the present disclosure, the plurality of compound eye structures includes a plurality of curved surfaces. Each of the plurality of curved surfaces has a radius of curvature between about 0.1 μm and about 5 μm. A height of the micro lens is greater than the radius of curvature.

In some embodiments of the present disclosure, the height of the micro lens is greater than or equal to about 5 μm.

In some embodiments of the present disclosure, each of the plurality of the curved surfaces is a spherical curved surface protruding away from the light-emitting element.

In some embodiments of the present disclosure, the light-emitting unit further includes a plurality of reflective walls. The reflective walls are disposed on a side wall of the light-emitting unit.

In some embodiments of the present disclosure, the light-emitting unit further includes a reflective layer. The reflective layer is disposed between the substrate and the light-emitting element as well as between the substrate and the micro lens.

In some embodiments of the present disclosure, the light-emitting element has at least one surface in direct contact with the reflective layer.

In some embodiments of the present disclosure, the micro lens has at least one surface in direct contact with the reflective layer.

Accordingly, in the light-emitting units of some embodiments of the present disclosure, by disposing the compound eye structures on the micro lenses, the light loss caused by the micro lenses and the light expansion angles of the light-emitting units may be reduced. Specifically, by arranging the compound eye structures adjacent to each other, the light-collecting areas of the micro lenses may be increased. The light loss caused by misalignments between the micro lenses and the light-emitting elements may also be reduced. In addition, by disposing reflective walls between any two of the light-emitting units, the light loss on the side walls of the micro lenses may be further reduced. Moreover, the light extraction efficiency of the micro lenses may be improved by adjusting the refractive index of the material of the micro lenses so that the refractive index of the material of the micro lenses is close to the light-emitting layer of the light-emitting element. Meanwhile, in the top view, the ratio of the aspect ratio of the compound eye structures to the aspect ratio of the light-emitting units is in a range from about 1 to about 1.5. Thereby, the shape of the light spot may be maintained while the light extraction efficiency increases.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
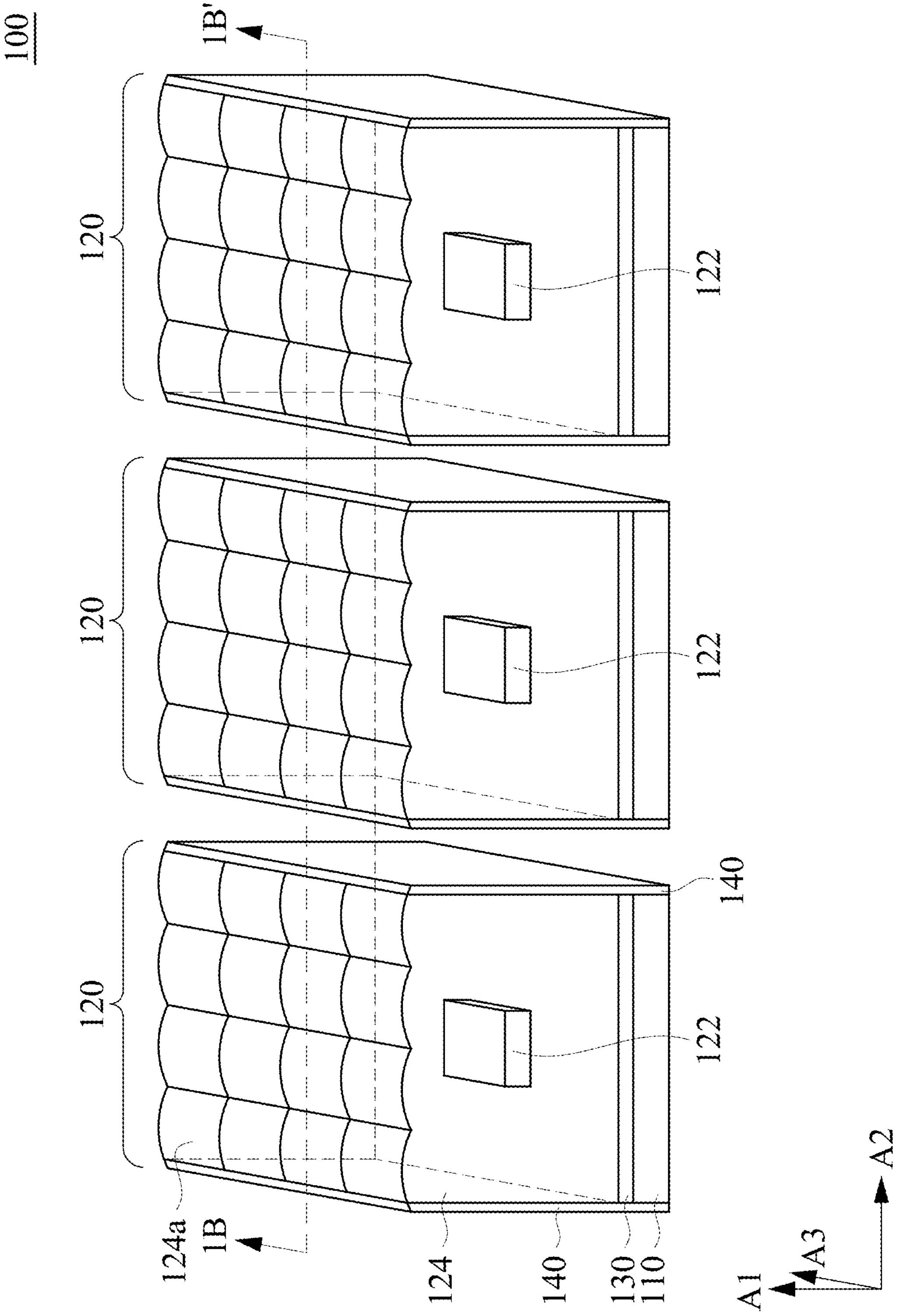
FIG. 1A is a schematic diagram of a light-emitting unit according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Figure 1B:
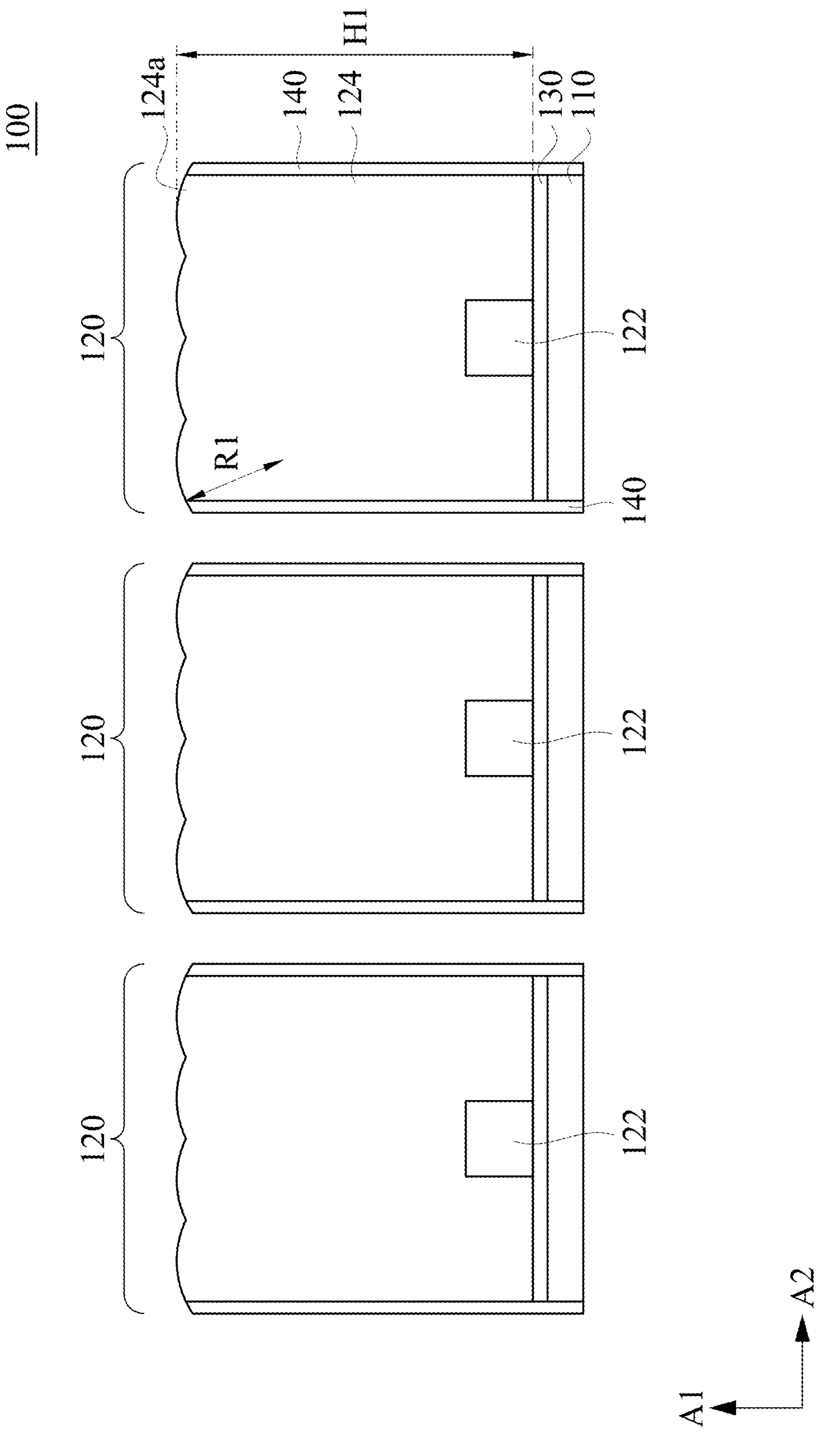
FIG. 1B is a cross-sectional side view of the light-emitting unit in FIG. 1A along the cutting plane line 1B-1B'.

Reference is made to FIG. 1A and FIG. 1B. FIG. 1A is a schematic diagram of light-emitting units 120 according to some embodiments of the present disclosure. FIG. 1B is a cross-sectional side view of the light-emitting units 120 in FIG. 1A along the cutting plane line 1B-1B'. Some embodiments of the present disclosure relate to a light-emitting unit 120. The light-emitting unit 120 includes a substrate 110, a light-emitting element 122, and a micro lens 124. The light-emitting element 122 is disposed on the substrate 110. The micro lens 124 surrounds the light-emitting element 122. The micro lens 124 includes a plurality of compound eye structures 124*a* adjacent to each other. In some embodiments, a plurality of light-emitting units 120 is disposed in a display device 100. For example, a plurality of light-emitting units 120 may be disposed at predetermined positions of the display device 100 through mass transfer and may be used as light sources of the display device 100. It should be noted that although three light-emitting units 120 are shown in FIG. 1A and FIG. 1B, in some other embodiments, the number of light-emitting units 120 is not limited to three. In some embodiments, the display device 100 is an augmented reality (AR) display.

As shown in FIG. 1A and FIG. 1B, the micro lens 124 is disposed above the light-emitting element 122 and surrounds a plurality of surfaces of the light-emitting element 122 protruding from the substrate 110. The plurality of compound eye structure 124*a* is disposed on a surface of the micro lens 124 away from the substrate 110. In some embodiments, the light-emitting unit 120 further includes a reflective layer 130. The reflective layer 130 is disposed between the substrate 110 and the light-emitting element 122 as well as between the substrate 110 and the micro lens 124. Each of the light-emitting elements 122 and the micro lens 124 has at least one surface in direct contact with the reflective layer 130. In some embodiments, the material of the reflective layer 130 includes a metal material, such as aluminum. However, other materials suitable for the reflective layer 130 may also be used.

As shown in FIG. 1A and FIG. 1B, the plurality of compound eye structures 124*a* on the micro lens 124 overlaps and covers the light-emitting element 122 in a first direction A1. The compound eye structures 124*a* of the micro lens 124 are adjacent to each other. The surface of the micro lens 124 away from the substrate 110 is completely covered by the plurality of compound eye structures 124*a*. The plurality of compound eye structure 124*a* reduces the optically ineffective zone on the micro lens 124 (compared to a micro lens without compound eye structures). For example, in some embodiments of the present disclosure, the optically inactive zone of the micro lens 124 is narrowed down to the edges where the compound eye structures 124*a* abut each other. As such, most of the light generated by the light-emitting element 122 passes through the plurality of compound eye structure 124*a* of the micro lens 124, thereby reducing light loss of the micro lens 124.

Also, the plurality of compound eye structures 124*a* reduces light loss caused by misalignments between the micro lens 124 and the light-emitting element 122. Since the light-emitting element 122 is covered by the plurality of compound eye structures 124*a* at the same time, a slight alignment error between the plurality of compound eye structures 124*a* and the light-emitting element 122 may not affect the imaging of the light-emitting unit 120. As such, not only is light loss caused by misalignments of the micro lens 124 and the light-emitting element 122 reduced, but alignment requirements between the micro lens 124 and the light-emitting element 122 during the manufacturing process are also brought down.

Figure 2A:
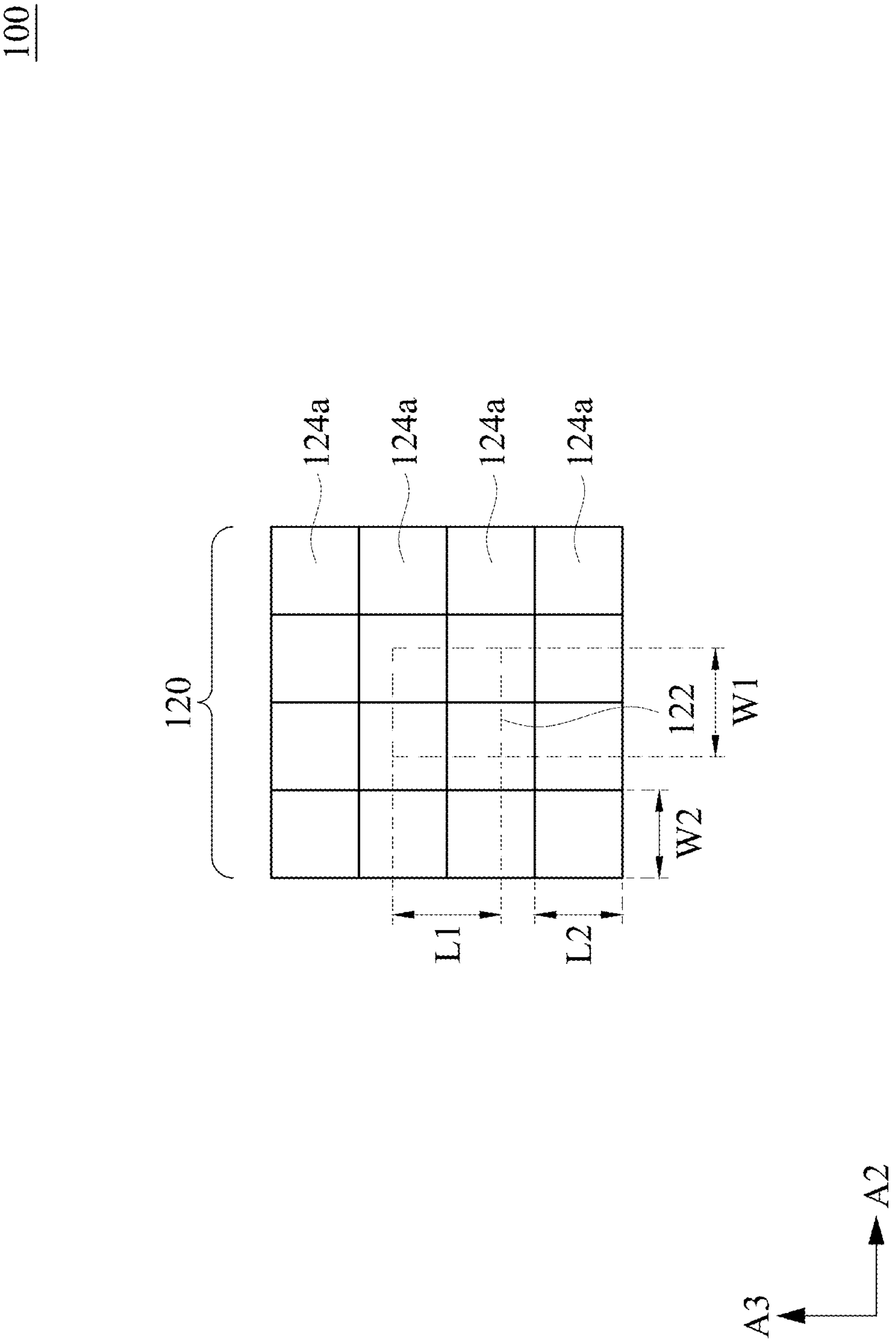
FIG. 2A is a top view of the light-emitting unit in FIG. 1A.

Reference is made to FIG. 1A and FIG. 2A. FIG. 2A is a top view of one of the light-emitting units 120 in FIG. 1A. In the top view, the plurality of compound eye structures 124*a* is arranged along a second direction A2 and a third direction A3. In some embodiments, an outline of each of the plurality of compound eye structures 124*a* is substantially rectangular. The compound eye structures 124*a* are arranged in a quadrilateral array. Each light-emitting element 122 has a width W1 in the second direction A2 and a length L1 in the third direction A3. Each of the plurality of compound eye structures 124*a* has a width W2 in the second direction A2 and a length L2 in the third direction A3. The length L1 and the width W1 of the light-emitting element 122 in the top view and the length L2 and the width W2 of each of the plurality of compound eye structures 124*a* in the top view substantially satisfy $1 \le (L1/W1)/(L2/W2) \le 1.5$. In other words, a ratio of the aspect ratio of the light-emitting element 122 in the top view (i.e., length L1/width W1) to the aspect ratio of the compound eye structure 124*a* in the top view (i.e., length L2/width W2) is in a range from about 1 to about 1.5. The ratio affects the shape of light spots generated by the light-emitting unit 120. It should be noted that the amount of light loss generated by the rectangular compound eye structures 124*a* arranged in the quadrilateral array may be less. The reason is that the sum of the boundary lengths of the rectangular compound eye structures 124*a* arranged in the quadrilateral array is relatively short, so less light is lost at the boundaries of the compound eye structures 124*a*.

By providing the ratio of the aspect ratio of the light-emitting element 122 in the top view to the aspect ratio of the compound eye structure 124*a* in the top view in a range from about 1 to about 1.5, the shape of the light spots of the light-emitting unit 120 is ensured to be closed to the shape of the light-emitting element 122, thereby avoiding deformation of the display result. In some embodiments, when the aspect ratio of the light-emitting element 122 in the top view is substantially the same as the aspect ratio of the compound eye structure 124*a* in the top view, better display performance may be achieved. If the ratio of the aspect ratio of the light-emitting element 122 in the top view to the aspect ratio of the compound eye structure 124*a* in the top view exceeds the range of about 1 and about 1.5, the shape of light spots generated by the light-emitting unit 120 may be changed. In addition, the range of the viewing angle of the light-emitting unit 120 in the second direction A2 and the third direction A3 may also be changed. For example, if the light-emitting element 122 is square in the top view (i.e., the aspect ratio is 1:1), and the aspect ratio of the compound eye structure 124*a* in the second direction A2 and the third direction A3 is 16:9, the light spots generated tend to be rectangular. Meanwhile, the viewing angle of the light-emitting unit 120 may be narrower in the second direction A2 and wider in the third direction A3. It should be noted that although the light-emitting elements 122 discussed above are presented as squares, considering the structures and shapes of different light-emitting units 120, the aspect ratio of the light-emitting elements 122 in the top view may be adjusted within an appropriate range to optimize the display result of the light-emitting unit 120. For example, in some embodiments, the aspect ratio (i.e., length L1/width W1) of the light-emitting element 122 in the top view may range from about 1 to about 2.

Figure 2B:
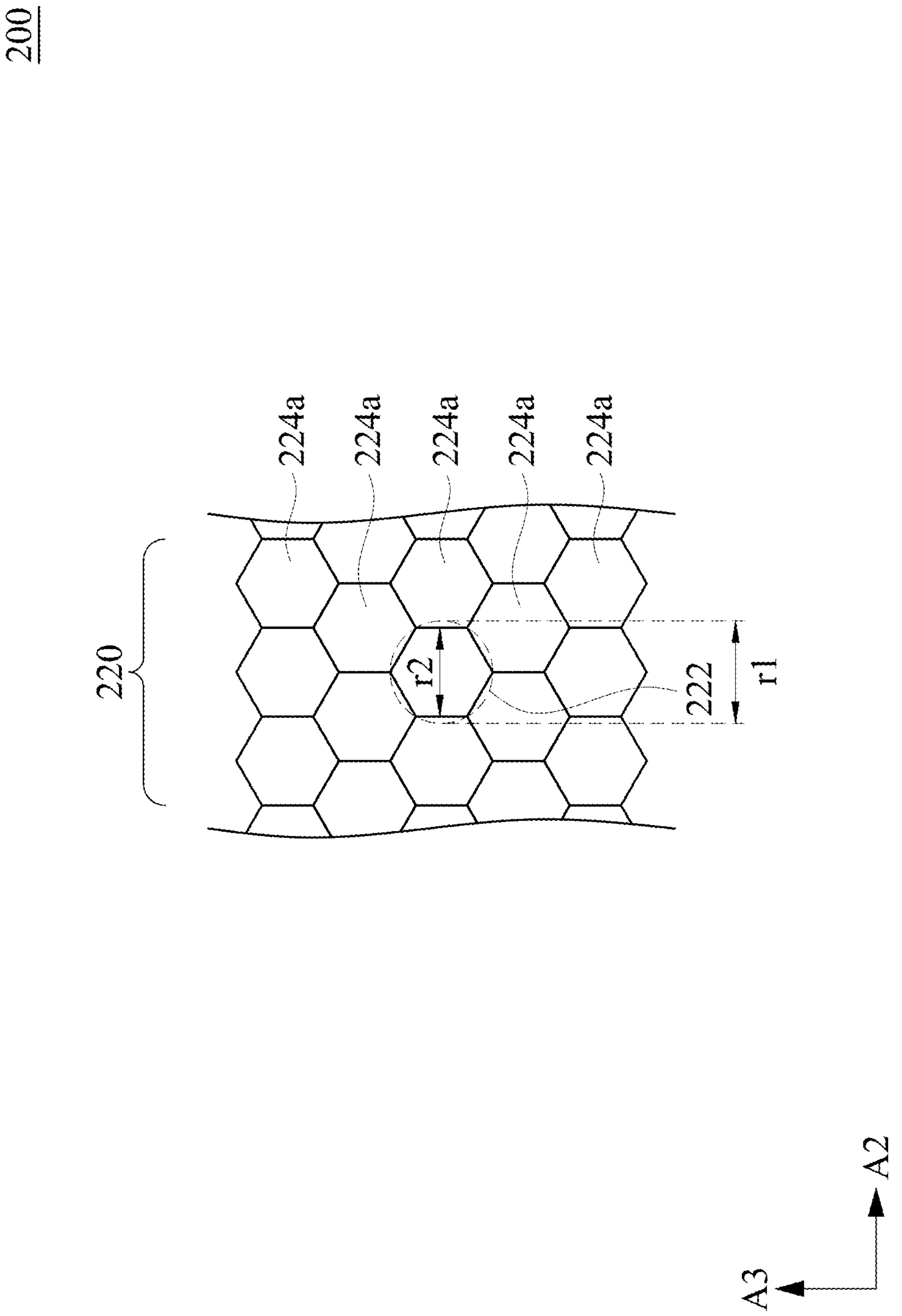
FIG. 2B is a top view of a light-emitting unit according to some other embodiments of the present disclosure.

Reference is made to FIG. 1 and FIG. 2B. FIG. 2B is a top view of a light-emitting unit 220 according to some other embodiments of the present disclosure. In some other embodiments, a display device 200 includes a light-emitting unit 220 similar to the aforementioned light-emitting units 120. The difference lies in that, in the top view, the light-emitting element 222 of the light-emitting unit 220 is substantially circular, and the outline of each of the plurality of compound eye structures 224*a* is substantially hexagonal. In the top view, the light-emitting element 222 has the shortest radial dimension r1. Each of the plurality of compound eye structure 224*a* has the shortest radial dimension r2. The shortest radial dimension r1 of the light-emitting element 222 in the top view and the shortest radial dimension r2 of each of the plurality of compound eye structure 224*a* in the top view substantially satisfy $1 \le (r1/r2) \le 1.5$. Radial dimensions represent the dimensions from one side of an object to its opposite side along a line passing through the center of the object. The shortest radial dimension in the top view represents the shortest one among a plurality of radial dimensions of the object in the top view. In addition, the compound eye structures 224*a* are arranged in a honeycomb array. The light-emitting unit 220 may be used to form an arc-shaped display screen. When the ratio of the shortest radial dimension r1 of the light-emitting element 222 in the top view to the shortest radial dimension r2 of each of the plurality of compound eye structure 224*a* in the top view is in the range from about 1 to about 1.5, deformation of the light spots generated by the light-emitting unit 220 may be prevented.

Please refer back to FIG. 1A and FIG. 1B. The micro lens 124 and the light-emitting layer of the light-emitting element 122 may include materials with different refractive indices (e.g., refractive index n1 and refractive index n2, respectively). For example, in some embodiments, the light-emitting layer of the light-emitting element 122 may include GaN (with a refractive index n2 of about 2.5), and the refractive index n1 of the micro lens 124 may be between about 1.7 and about 1.9. The closer the refractive index n1 and the refractive index n2 are, the lower the probability of total reflection of light occurring while the light entering the micro lens 124 may be. Thus, the light extraction efficiency of the micro lens 124 may be improved. In some embodiments, the material of the micro lens 124 may include nanomaterials, for example, PixNIL™ ST2 (with a refractive index of about 1.9), PixNIL™ SFZ1 (with a refractive index of about 1.65), optical glass (with a refractive index between about 1.8 and about 1.88), and optical coatings, for example, IKRON IOC-132 (with a refractive index of about 1.8), combinations thereof, or the like.

In some embodiments, the material of the micro lens 124 may also include nanoimprint materials. In one embodiment, a plurality of compound eye structures 124*a* may be fabricated simultaneously in a large area on the micro lens 124 by a nanoimprint process. After the compound eye structures 124*a* are formed, the nanoimprint material can be cured by irradiating light in a specific wavelength (for example, ultraviolet light) or heating. The refractive index n1 of the cured nanoimprint material may be between about 1.7 and about 2, or even greater than about 2. As such, the refractive index n1 of the micro lens 124 will be closer to the refractive index n2 of the light-emitting layer of the light-emitting element 122, improving the light extraction efficiency of the micro lens 124. In addition, the cured nanoimprint material has excellent light transmittance, for example, light transmittance between about 85% and about 99.5%.

As shown in FIG. 1A and FIG. 1B, the compound eye structures 124*a* include curved surfaces. Each curved surface is a spherical curved surface protruding away from the light-emitting element 122. In some embodiments, each of the plurality of compound eye structures 124*a* has the same radius of curvature R1. In addition, the micro lens 124 has a height H1. The height H1 is the distance between the top of the compound eye structure 124*a* and the top of the reflective layer 130. In some embodiments, if the light-emitting unit 120 does not include the reflective layer 130, the height H1 is the distance between the top of the compound eye structure 124*a* and the top of the substrate 110. In some embodiments, the radius of curvature R1 of each curved surface of the compound eye structure 124*a* is between about 0.1 μm and about 5 μm. The distance from the top of each curved surface to the substrate 110 (i.e., the height H1) is greater than the radius of curvature R1 to provide better optical performance.

For example, when the radius of curvature R1 is about 5 μm, the height H1 of the micro lens 124 may be greater than or equal to about 5 μm. If the height H1 of the micro lens 124 is smaller than the radius of curvature R1, the micro lens 124 may not have enough volume to form a proper shape of the micro lens 124. If the height H1 of the micro lens 124 is much larger than the radius of curvature R1, the light absorption of the micro lens 124 may be increased, therefore reducing the light extraction efficiency of the micro lens 124. In some embodiments, the height H1 is in a range from about 5 μm to about 50 μm. Moreover, the radius of curvature R1 of the compound eye structure 124*a* is in a range from about 0.1 μm to about 5 μm. When the radius of curvature R1 is greater than about 5 μm, the probability of total reflection of light by the micro lens 124 may increase. When the radius of curvature R1 is smaller than about 0.1 μm, the focusing effect of the compound eye structure 124*a* may become poor. In addition, the optical performance of the light-emitting unit 120 must be considered when determining the radius of curvature R1 and the height H1 of the micro lens 124. For example, in some embodiments, when the radius of curvature R1 is about 0.1 μm (or the radius of curvature R1 is close to about 0.1 μm), the height H1 of the micro lens 124 may be greater than or equal to about 5 μm, so that the light emitted by the light-emitting element 122 provides suitable optical deflection effects.

In summary, when the radius of curvature R1 is closer to about 0.1 μm with the micro lens 124 having a sufficient height H1 (for example, the height H1 is greater than or equal to about 5 μm), the light-emitting angle of the light-emitting unit 120 may be narrowed and the light extraction efficiency of the micro lens may be improved. By properly matching the height H1 and the radius of curvature R1 of the light-emitting unit 120, the light-emitting range of the light-emitting unit 120 may be controlled and the light extraction efficiency of the light-emitting unit 120 may be improved at the same time. In some embodiments, the light-emitting element 122 is an omnidirectional miniature light-emitting diode. The light-emitting angle of the light-emitting unit 120 is between about 80 degrees and about 120 degrees.

As shown in FIG. 1A and FIG. 1B, in some embodiments, the light-emitting unit 120 further includes a plurality of reflective walls 140. The plurality of reflective walls 140 is disposed on a plurality of side walls of the light-emitting unit 120 and is substantially perpendicular to the substrate 110. In some embodiments, the display device 100 includes a plurality of light-emitting units 120. The reflective walls 140 separate adjacent two of the light-emitting units 120. In some embodiments, the reflective walls 140 are formed on the side walls of the light-emitting units 120 and separate adjacent two of the light-emitting units 120 in the second direction A2. In some embodiments, the material of the reflective walls 140 may be similar or identical to that of the reflective layer 130. Arranging the reflecting wall 140*s* between any two of the light-emitting units 120 prevents the light emitted by the light-emitting elements 122 from exiting the side walls of the micro lens 124, thereby reducing light loss at the side walls of the micro lens 124 and improving the light extraction efficiency of the light-emitting unit 120.

The light-emitting unit 120 discussed above is suitable for application in an AR display. The light-emitting unit 120 has high light extraction efficiency, which may increase the light intensity of the light source of the AR display. In addition, in the AR display, the light emitted by the light source must pass through the imaging lens before imaging. In this case, the light-emitting unit 120 can evenly distribute the light within the light-collecting area of the imaging lens and increase the light intensity within the light-collecting area of the imaging lens. Therefore, the luminous efficiency of the AR display may be effectively improved.

The following discusses light extraction efficiencies, light spot simulation results, and light distribution curves of some light-emitting units 120 with different parameters, for example, light-emitting units 120 with different material refractive indices n1 of the micro lens 124, different heights H1 of the micro lens 124, different radii of curvature R1 of the compound eye structures 124*a* as well as light-emitting units 120 with and/or without reflective walls 140. Reference is made to FIG. 1A and FIG. 3A to FIG. 7B. FIG. 3A, FIG. 4A, FIG. 5A, FIG. 6A, and FIG. 7A are simulation results of light spots generated by light-emitting units 120 according to some embodiments of the present disclosure. FIG. 3B, FIG. 4B, FIG. 5B, FIG. 6B, and FIG. 7B are light distribution curves of the light-emitting units 120 according to some embodiments of the present disclosure.

Figure 3A:
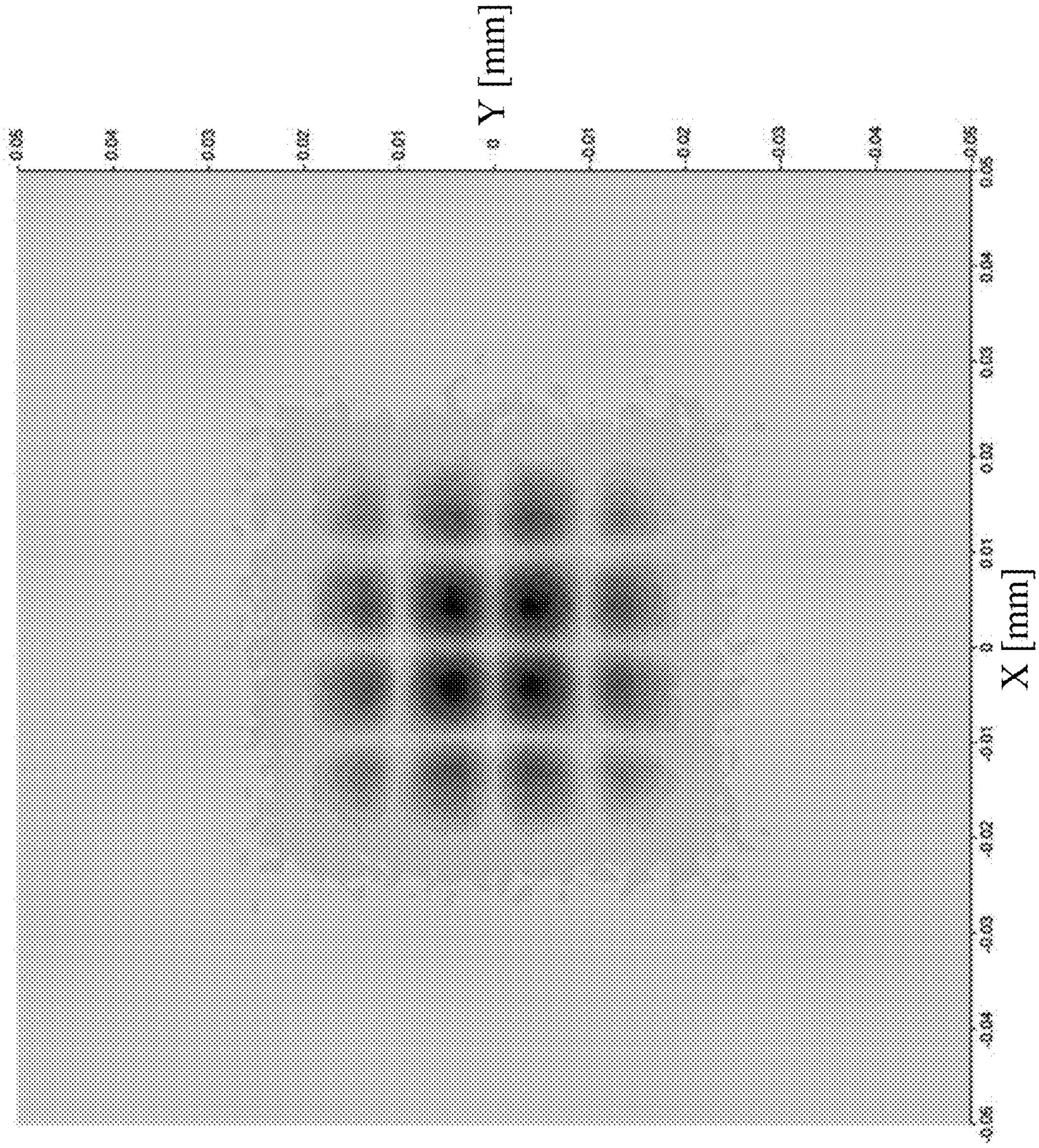
FIG. 3A, FIG. 4A, FIG. 5A, FIG. 6A, and FIG. 7A are simulation results of light spots generated by light-emitting units according to some embodiments of the present disclosure.
Figure 3B:
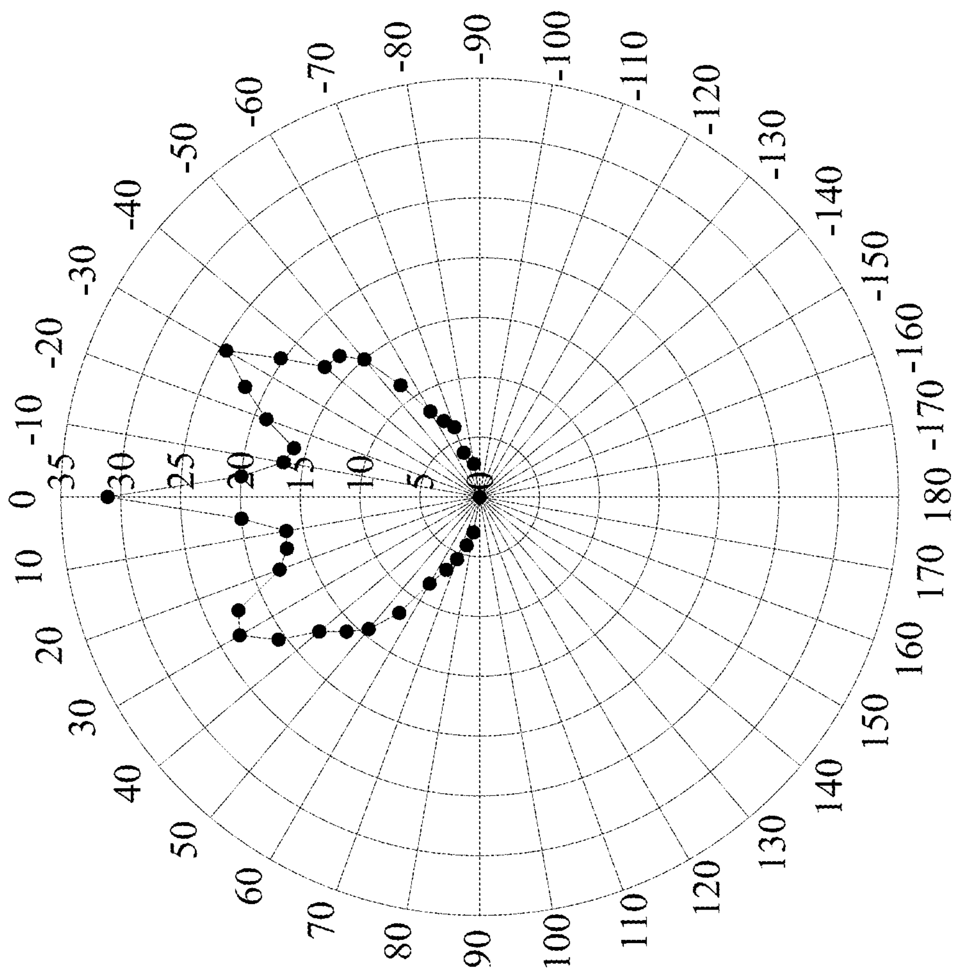
FIG. 3B, FIG. 4B, FIG. 5B, FIG. 6B, and FIG. 7B are light distribution curves of the light-emitting units according to some embodiments of the present disclosure.

Reference is firstly made to FIG. 1A, FIG. 3A, and FIG. 3B. In one embodiment of the light-emitting unit 120 of the present disclosure, the material of the light-emitting layer of the light-emitting element 122 includes GaN. Thus, the refractive index n2 of the light-emitting layer of the light-emitting element 122 is about 2.5, while the refractive index n1 of the micro lens 124 is about 1.5. The height H1 of the micro lens 124 is about 10 μm. The radius of curvature R1 of the compound eye structure 124*a* is about 5 μm. The light-emitting unit 120 of this embodiment has a light extraction efficiency of about 56.05%. It should be noted that the light extraction efficiency here is obtained from the light intensity of the light emitted by the light-emitting element 122 and the light intensity after the light passes through the compound eye structure 124*a*. For example, if the light intensity of the light emitted by the light-emitting element 122 is about 1 unit light intensity, and the light intensity after the light passes through the compound eye structure 124*a* is about 0.5605 unit light intensity, it can be concluded that the light extraction efficiency of the light-emitting unit 120 is about 56.05%. The light spot shown in FIG. 3A is divided into a plurality of light regions in the X-direction and the Y-direction. The light regions closer to the origin of the coordinates have stronger light intensity (i.e., darker light regions have stronger light intensity). The light spot has substantially a square outline. In FIG. 3B, the light intensity has peaks at three positions where the light-emitting angles are about +30 degrees, about 0 degrees, and about −30 degrees, respectively.

Figure 4A:
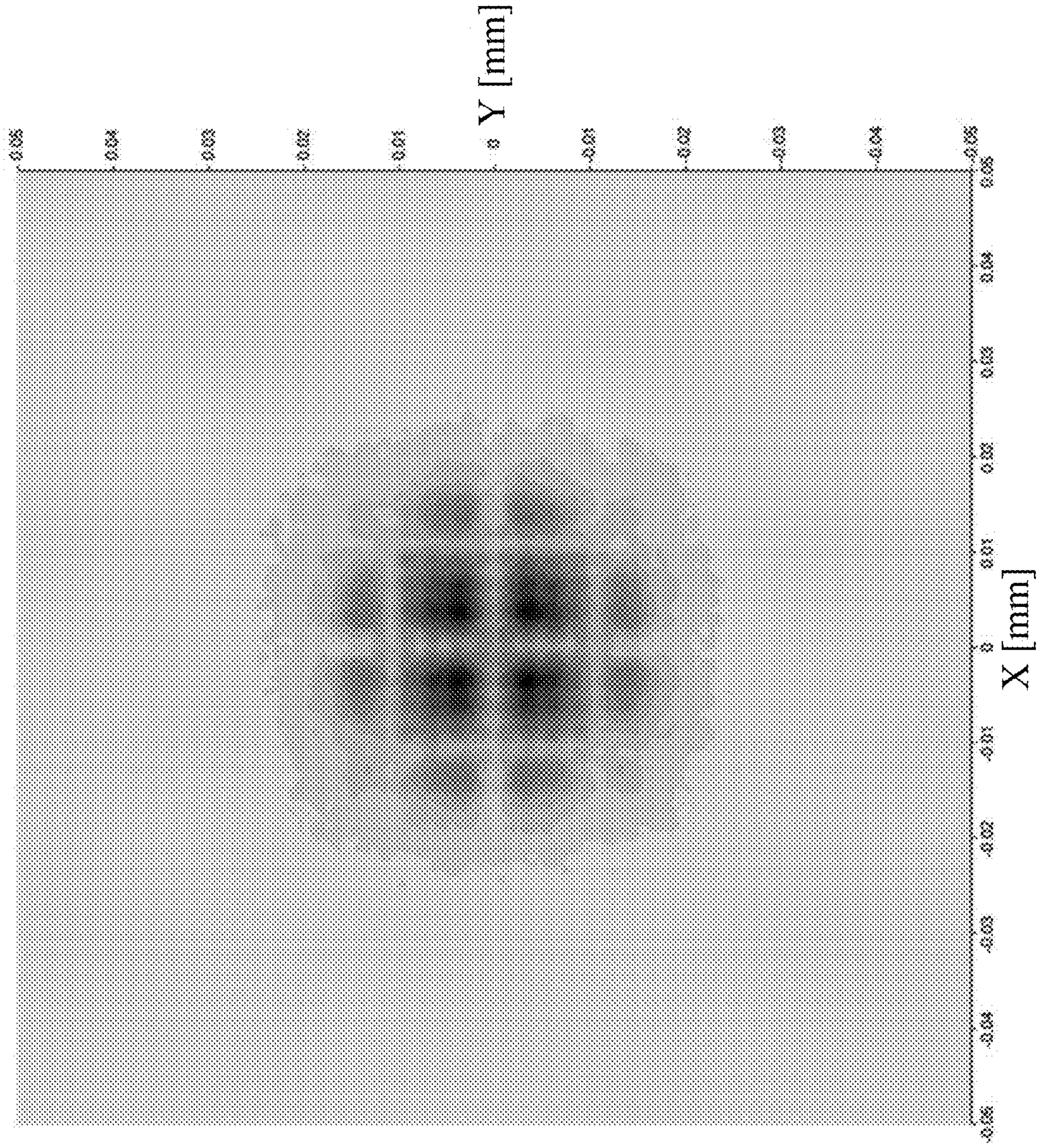
Figure 4B:
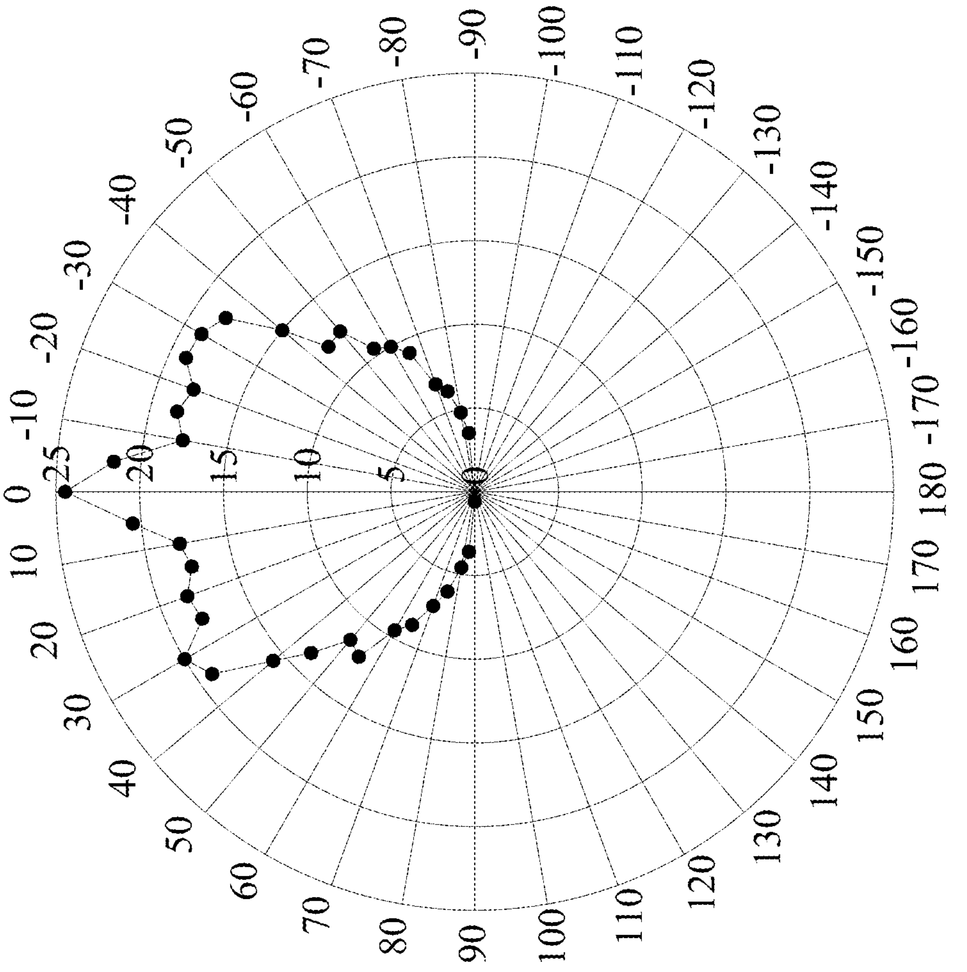

Reference is made to FIG. 1A, FIG. 4A, and FIG. 4B. In another embodiment of the light-emitting unit 120 of the present disclosure, the refractive index n1 of the micro lens 124 is about 1.9. The height H1 of the micro lens 124 is about 10 μm. The radius of curvature R1 of the compound eye structure 124*a* is about 5 μm. The light-emitting unit 120 of this embodiment has a light extraction efficiency of about 62.4%. The light spot in FIG. 4A is divided into a plurality of light regions in the X-direction and the Y-direction. The light regions close to the origin of the coordinates have obvious light intensity enhancement, while the light regions far from the origin of the coordinates have obvious light intensity reduction. Therefore, the light spot has a substantially circular outline. In addition, in FIG. 4B, the light intensity value of the three peaks at the light-emitting angles of about +30 degrees, about 0 degrees, and about −30 degrees are increased. The aforementioned phenomena of concentrating the light regions of the light spots and increasing the peak light intensity values are due to the refractive index n1 of the micro lens 124 closer to the refractive index n2 of the light-emitting layer.

Figure 5A:
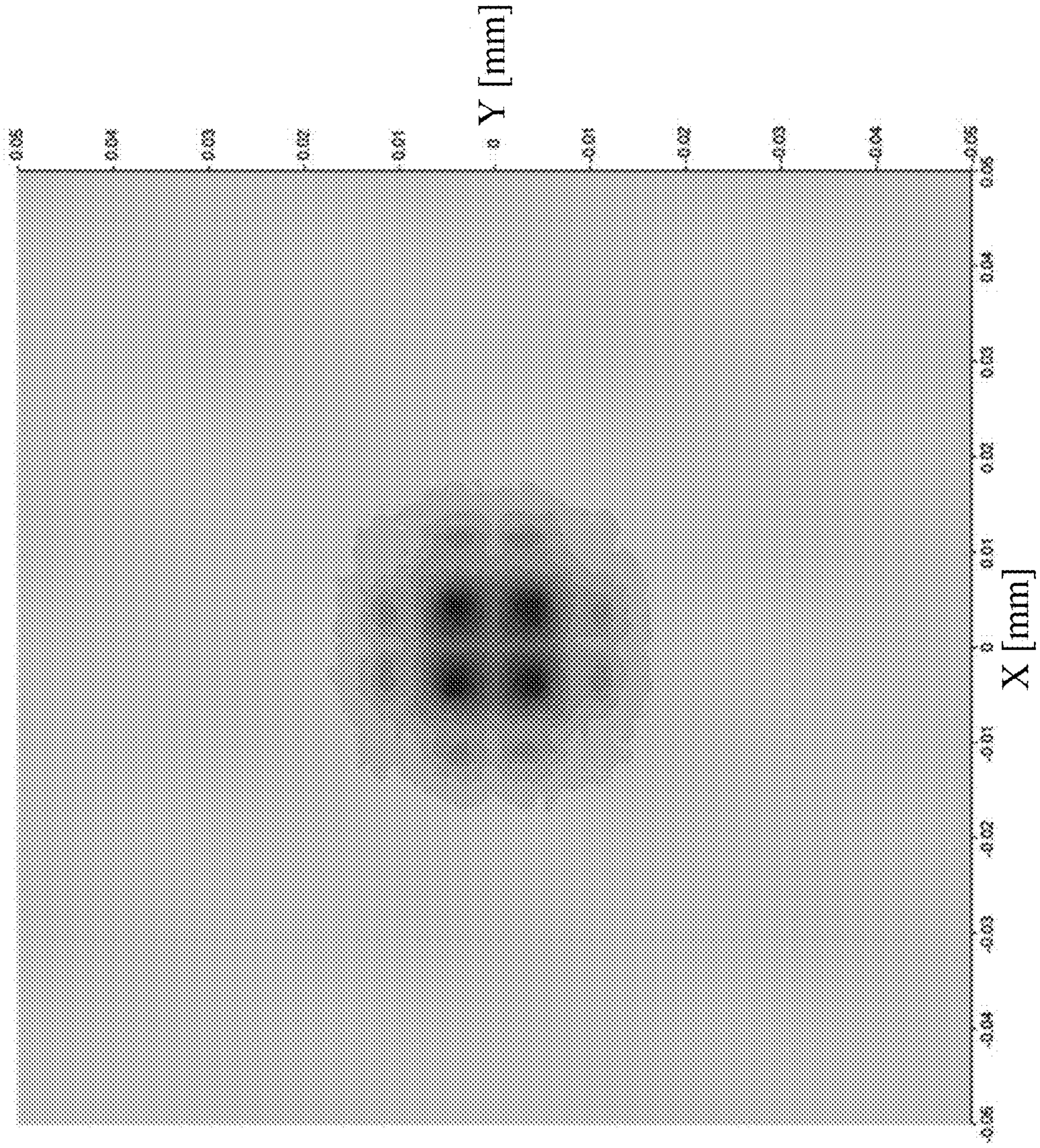
Figure 5B:
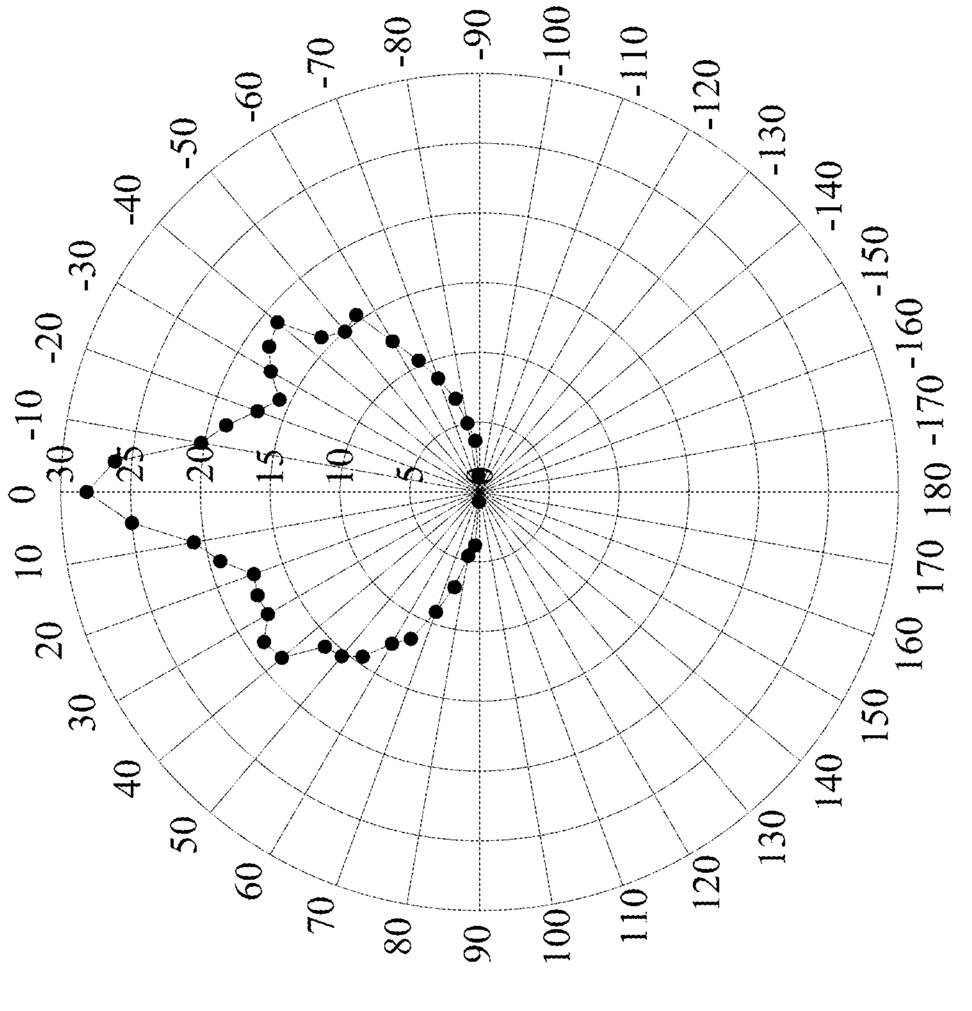

Reference is made to FIG. 1A, FIG. 5A and FIG. 5B. In yet another embodiment of the light-emitting unit 120 of the present disclosure, the refractive index n1 of the micro lens 124 is about 1.9. The height H1 of the micro lens 124 is about 5 μm. The radius of curvature R1 of the compound eye structure 124*a* is about 5 μm. The light-emitting unit 120 of this embodiment has a light extraction efficiency of about 66.91%. The light spot in FIG. 5A is divided into a plurality of light regions in the X-direction and the Y-direction. Multiple light regions tend to gather toward the origin of coordinates and connect to each other, while the light intensity of light regions far away from the origin of coordinates is weakened. In FIG. 5B, the peaks are respectively disposed at the three places where the light-emitting angles are about +40 degrees, about 0 degrees, and about −40 degrees. The light intensity values of these peaks are increased. The peak at the light-emitting angle of about 0 degrees has a larger increase in the light intensity value. The aforementioned phenomena of concentrated light regions of the light spot, increased peak light intensity values, and expanded light-emitting angles are due to the adjustment of the height H1 of the micro lens 124 to be closer to about 5 μm.

Figure 6A:
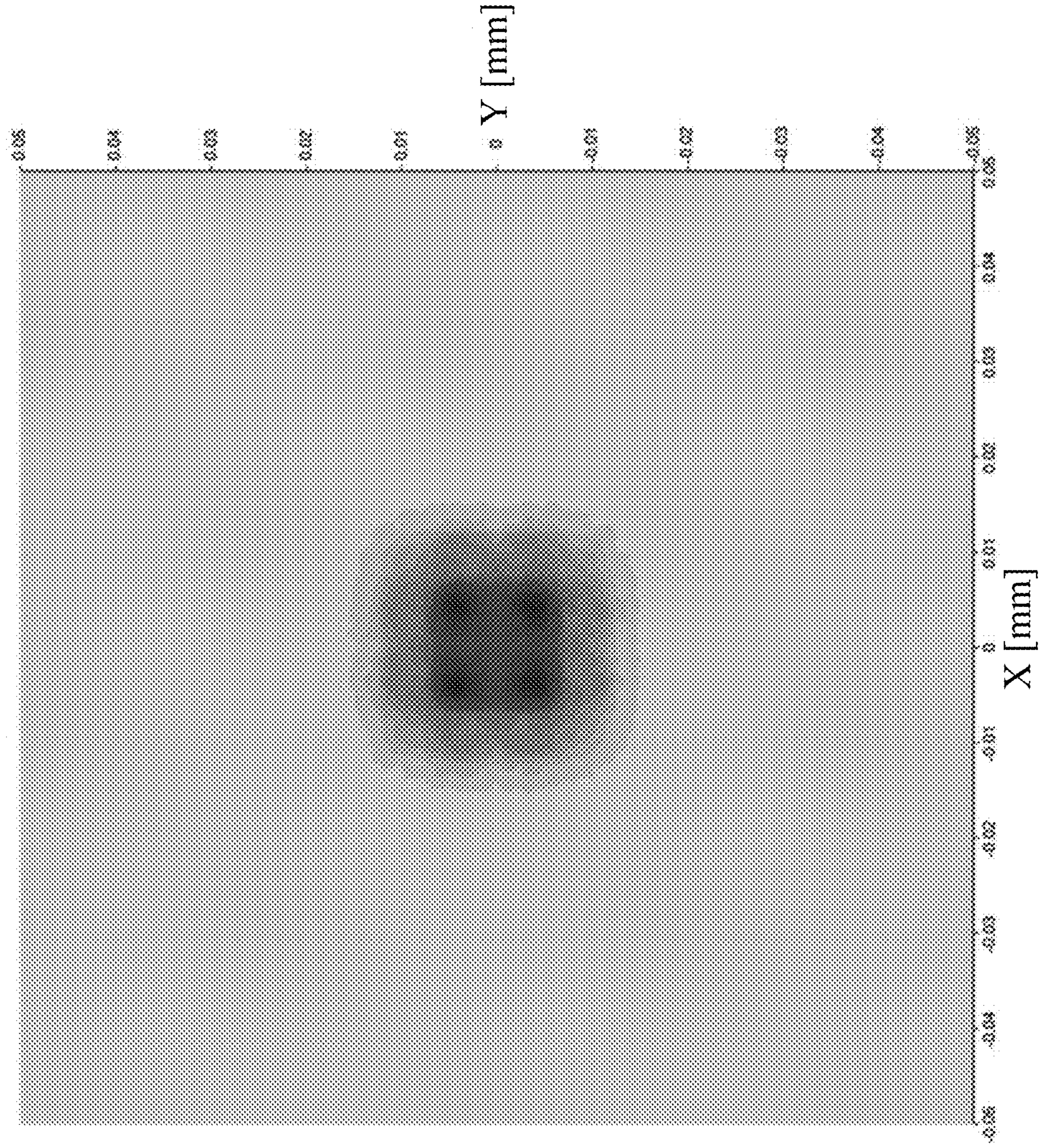
Figure 6B:
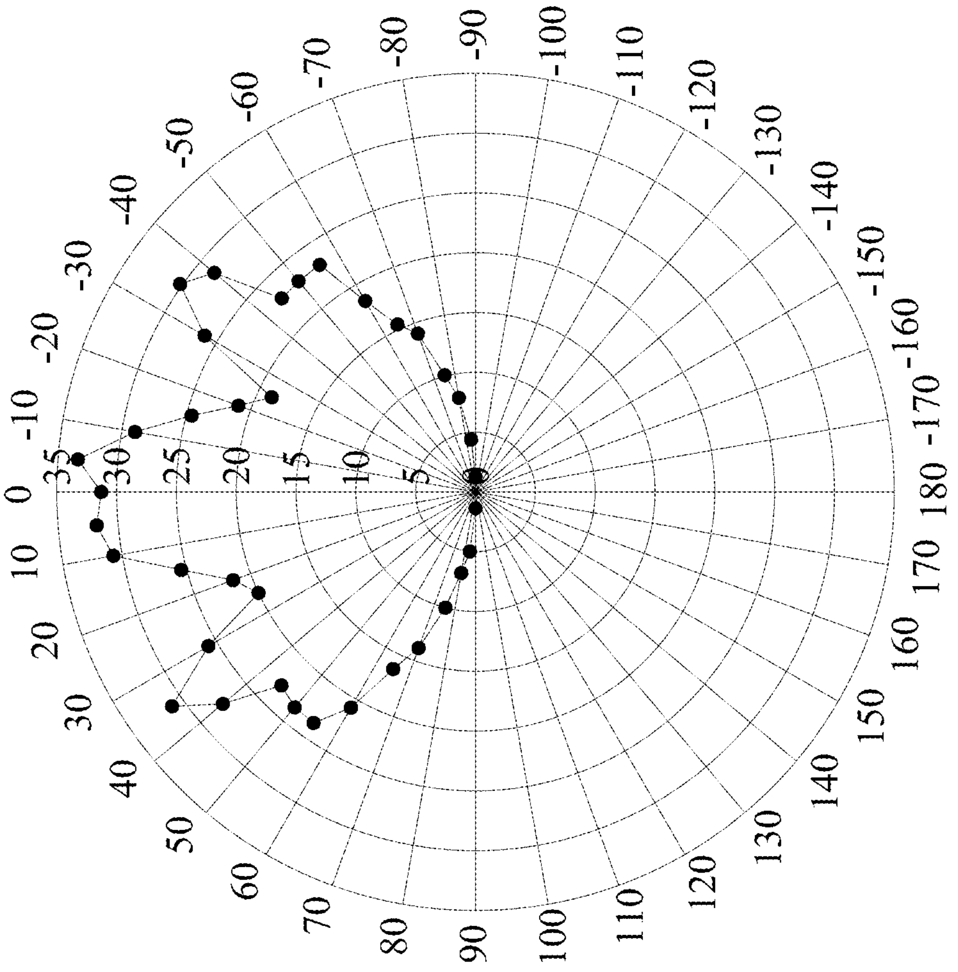

Reference is made to FIG. 1A, FIG. 6A, and FIG. 6B. In yet another embodiment of the light-emitting unit 120 of the present disclosure, the refractive index n1 of the micro lens 124 is about 1.9. The height H1 of the micro lens 124 is about 5 μm. The radius of curvature R1 of the compound eye structure 124*a* is about 5 μm. The light-emitting unit 120 has reflective walls 140. The light-emitting unit 120 of this embodiment has a light extraction efficiency of about 96.67%. The light spot in FIG. 6A has a plurality of light regions that converges toward the origin of the coordinates and is connected to each other. The peaks shown in FIG. 6B are disposed at the three places where the light-emitting angles are about +35 degrees, about 0 degrees, and about −35 degrees. The light intensity values of these peaks are increased. The peaks at the light-emitting angles of about +35 degrees and about −35 degrees have larger increases in the light intensity values. The foregoing phenomena of concentrated light regions of the light spot, increased peak light intensity values, and narrowed light-emitting angles are due to the reflective walls 140 disposed on the light-emitting unit 120.

Figure 7A:
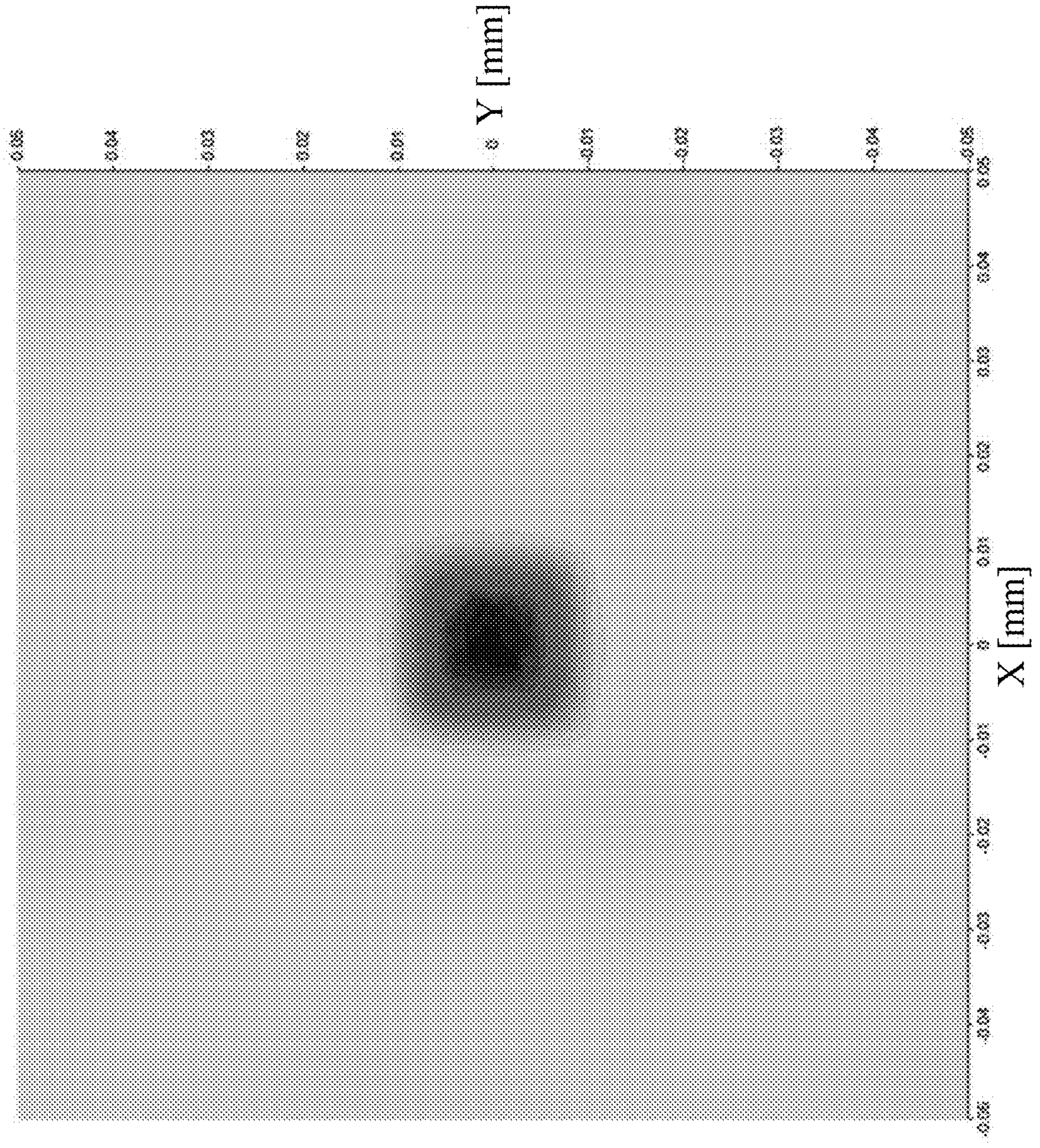
Figure 7B:
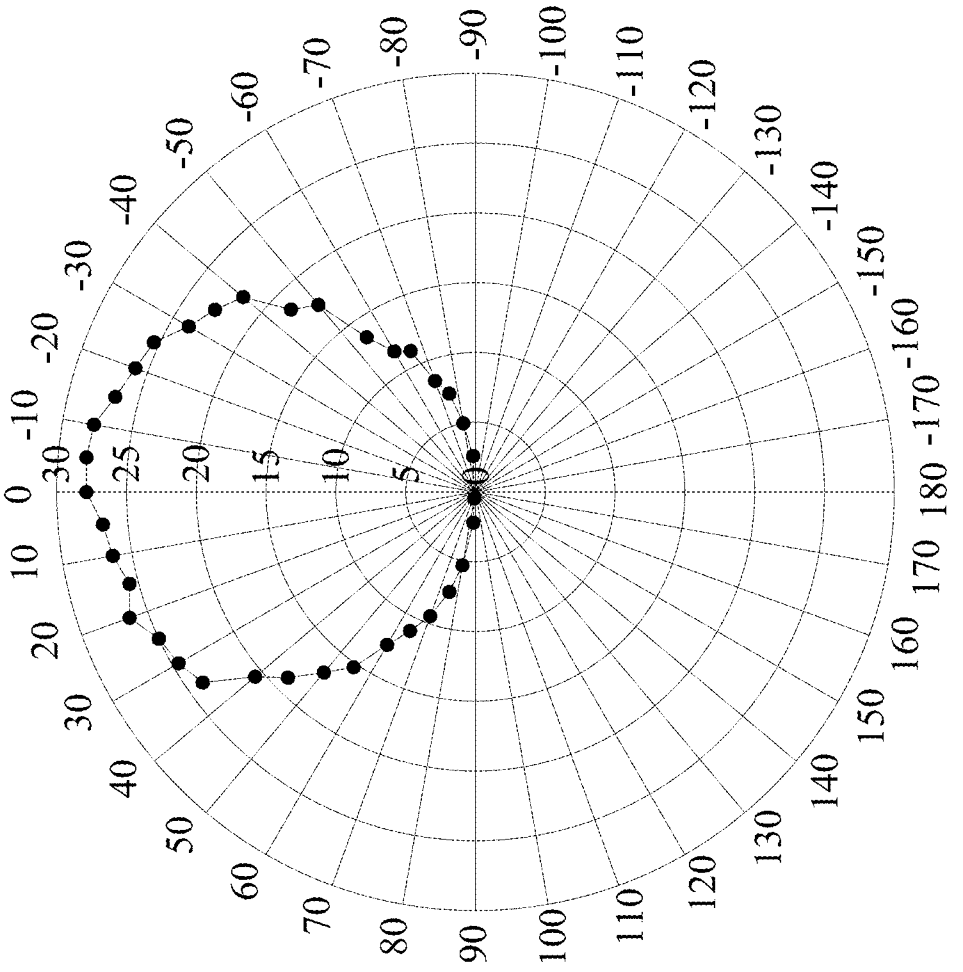

Reference is made to FIG. 1A, FIG. 7A, and FIG. 7B. In another embodiment of the light-emitting unit 120 of the present disclosure, the refractive index n1 of the micro lens 124 is about 1.9. The height H1 of the micro lens 124 is about 10 μm. The radius of curvature R1 of the compound eye structure 124*a* is about 0.8 μm. The light-emitting unit 120 has reflective walls 140. The light-emitting unit 120 of this embodiment has a light extraction efficiency of about 84.67%. The light spot in FIG. 7A has a single light region disposed at the origin of the coordinates. The light intensity shown in FIG. 7B is evenly distributed at the light-emitting angles between about +35 degrees and about −35 degrees. In this embodiment, although the light-emitting unit 120 sacrifices part of the light extraction efficiency, it obtains a relatively uniform light intensity distribution in the light-emitting angle. Such light-emitting unit 120 with uniform light distribution, concentrated light-emitting angles, and high light extraction efficiency is suitable for application in AR displays.

According to the foregoing recitations of the embodiments of the disclosure, it may be seen that in the light-emitting units of some embodiments of the present disclosure, by disposing the compound eye structures on the micro lenses, the light loss caused by the micro lenses and the light expansion angles of the light-emitting units may be reduced. Specifically, by arranging the compound eye structures adjacent to each other, the light-collecting areas of the micro lenses may be increased. The light loss caused by misalignments between the micro lenses and the light-emitting elements may also be reduced. In addition, by disposing reflective walls between any two of the light-emitting units, the light loss on the side walls of the micro lenses may be further reduced. Moreover, the light extraction efficiency of the micro lenses may be improved by adjusting the refractive index of the material of the micro lenses so that the refractive index of the material of the micro lenses is close to the light-emitting layer of the light-emitting element. Meanwhile, in the top view, the ratio of the aspect ratio of the compound eye structures to the aspect ratio of the light-emitting units is in a range from about 1 to about 1.5. Thereby, the shape of the light spot may be maintained while the light extraction efficiency increases.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A light-emitting unit, comprising:

a substrate;

a light-emitting element disposed on the substrate;

a micro lens surrounding the light-emitting element, wherein the micro lens comprises a plurality of compound eye structures adjacent to each other, wherein in a top view, each of the plurality of compound eye structures has a length and a width, the light-emitting element has a length and a width, and the length and the width of the light-emitting element in the top view and the length and the width of each of the plurality of compound eye structures in the top view substantially satisfy: $1=(L1/W1)/(L2/W2)\leq 1.5$, wherein W1 is the width of the light-emitting element in the top view, L1 is the length of the light-emitting element in the top view, W2 is the width of each of the plurality of compound eye structures in the top view, L2 is the length of each of the plurality of compound eye structures in the top view; and a reflective layer disposed between the substrate and the light-emitting element as well as between the substrate and the micro lens, wherein the micro lens has at least one surface in direct contact with the reflective layer.

2. The light-emitting unit of claim 1, wherein the plurality of compound eye structures comprises a plurality of curved surfaces, each of the plurality of curved surfaces has a radius of curvature between about 0.1 μm and about 5 μm, and a height of the micro lens is greater than the radius of curvature wherein the height of the micro lens is a distance between a topmost point of the curved surfaces and a bottom surface of the micro lens.

3. The light-emitting unit of claim 2, wherein the height of the micro lens is greater than or equal to about 5 μm.

4. The light-emitting unit of claim 2, wherein each of the plurality of the curved surfaces is a spherical curved surface protruding away from the light-emitting element.

5. The light-emitting unit of claim 1, wherein the micro lens has a refractive index, and the refractive index is between about 1.7 and about 1.9.

6. The light-emitting unit of claim 1, further comprising:

a plurality of reflective walls disposed on a side wall of the light-emitting unit.

7. The light-emitting unit of claim 1, wherein in the top view, an edge of each of the plurality of compound eye structures is substantially a rectangle.

8. The light-emitting unit of claim 1, wherein the light-emitting element is an omni-angle micro light-emitting diode, and a light-emitting angle of the light-emitting unit is between about 80 degrees and about 120 degrees.

9. The light-emitting unit of claim 1, wherein in the top view, an edge of each of the plurality of compound eye structures is substantially a hexagon.

10. A light-emitting unit, comprising:

a substrate;

a light-emitting element disposed on the substrate;

a micro lens surrounding the light-emitting element, wherein the micro lens includes a plurality of compound eye structures adjacent to each other, wherein in a top view, the light-emitting element has a shortest radial dimension, each of the plurality of compound eye structures has a shortest radial dimension, and the shortest radial dimension of the light-emitting element in the top view and the shortest radial dimension of each of the plurality of compound eye structures in the top view substantially satisfy $1 \leq (r1/r2) \leq 1.5$, wherein r1 is the shortest radial dimension of the light-emitting element in the top view, and r2 is the shortest radial dimension of each of the plurality of compound eye structures in the top view; and a reflective layer disposed between the substrate and the light-emitting element as well as between the substrate and the micro lens, wherein the micro lens has at least one surface in direct contact with the reflective layer.

11. The light-emitting unit of claim 10, wherein in the top view, an outline of each of the plurality of compound eye structures is substantially a hexagon.

12. The light-emitting unit of claim 10, wherein the plurality of compound eye structures comprises a plurality of curved surfaces, each of the plurality of curved surfaces has a radius of curvature between about 0.1 μm and about 5 μm, and a height of the micro lens is greater than the radius of curvature, wherein the height of the micro lens is a distance between a topmost point of the curved surfaces and a bottom surface of the micro lens.

13. The light-emitting unit of claim 12, wherein the height of the micro lens is greater than or equal to about 5 μm.

14. The light-emitting unit of claim 12, wherein each of the plurality of the curved surfaces is a spherical curved surface protruding away from the light-emitting element.

15. The light-emitting unit of claim 10, further comprising:

a plurality of reflective walls disposed on a side wall of the light-emitting unit.

16. The light-emitting unit of claim 10, wherein the light-emitting element has at least one surface in direct contact with the reflective layer.

* * * * *